United States Patent
Takahashi et al.

(10) Patent No.: US 8,174,871 B2
(45) Date of Patent: *May 8, 2012

(54) MEMORY CELL ARRAY

(75) Inventors: Tsuyoshi Takahashi, Tsukuba (JP); Yutaka Hayashi, Tsukuba (JP); Yuichiro Masuda, Tsukuba (JP); Shigeo Furuta, Tsukuba (JP); Masatoshi Ono, Tsukuba (JP)

(73) Assignees: Funai Electric Advanced Applied Technology Research Institute Inc., Daito-shi (JP); Funai Electric Co., Ltd., Daito-shi (JP)

( * ) Notice: Subject to any disclaimer, the term of this patent is extended or adjusted under 35 U.S.C. 154(b) by 190 days.

This patent is subject to a terminal disclaimer.

(21) Appl. No.: 12/644,608

(22) Filed: Dec. 22, 2009

(65) Prior Publication Data
US 2010/0165696 A1    Jul. 1, 2010

(30) Foreign Application Priority Data
Dec. 26, 2008  (JP) .................................. 2008-334129

(51) Int. Cl.
*G11C 11/00* (2006.01)
(52) U.S. Cl. ........................... 365/158; 365/63; 365/148
(58) Field of Classification Search .................... 365/63, 365/148, 158
See application file for complete search history.

(56) References Cited

U.S. PATENT DOCUMENTS
2009/0256130 A1*  10/2009  Schricker ........................ 257/4
2010/0165695 A1*  7/2010  Takahashi et al. .............. 365/63

FOREIGN PATENT DOCUMENTS
| JP | 2000-269358 A | 9/2000 |
| JP | 2005-79335 A | 3/2005 |
| JP | 2008-243986 A | 10/2008 |

* cited by examiner

*Primary Examiner* — Hoai V Ho
*Assistant Examiner* — Anthan Tran
(74) *Attorney, Agent, or Firm* — Crowell & Moring LLP

(57) ABSTRACT

Disclosed is a memory cell array including word and first bit lines and second bit lines respectively connected to memory cells, wherein each memory cell includes a MOS transistor and switching element having first and second conductive layers and a gap in which a resistance value changes by applying a predetermined voltage, and data is written by specifying the first bit line to connect it to a ground, specifying the word line and supplying a write voltage to the second bit lines, and read by specifying the word line, and specifying the first bit line to supply a read voltage lower than the write voltage to the second bit lines, and the word line is specified when the voltage of the word line becomes a gate threshold value voltage or more and a sum of a drive voltage and the gate threshold value voltage or less.

3 Claims, 8 Drawing Sheets

MEMORY CELL ARRAY

BACKGROUND OF THE INVENTION

1. Field of the Invention

The present invention relates to a memory cell array.

2. Description of Related Art

Currently, further miniaturization of an electrical element is desired as a device is getting smaller and its density is increasing. As an example of such case, there has been known a switching element which can perform a switching operation by applying a voltage between two conductive bodies facing each other across a microscopic space (nanogap).

Specifically, for example, there has been developed a switching element which is composed of stable material of oxide silicon and gold, manufactured by a simple manufacturing method of oblique vapor deposition, and capable of repeating switching operation stably (for example, see Japanese Patent Application Laid-Open No. 2005-79335).

There has also been developed a switching element which can be arranged at a high density and its integration becomes easy by aligning two conductive bodies facing each other across a nanogap in vertical direction (for example, see Japanese Patent Application Laid-Open No. 2008-243986).

In order to apply such switching element (hereinafter referred to as "nanogap element") including the nanogap to a high-density memory, it is necessary to relate a "low resistance state" and "high resistance state" which corresponds to "ON" and "OFF" respectively to "zero (0)" and "one (1)" of the memory, and arranging nanogap elements in an array to construct a memory cell array.

Conventionally, as a memory cell array, there has been known a Dynamic Random Access Memory (DRAM) memory cell array (for example, see Japanese Patent Application Laid-Open No. 2000-269358).

A memory cell provided in the DRAM memory cell array includes, for example, a memory cell containing a metal-oxide semiconductor (MOS) transistor and a capacitor as shown in FIG. 8.

As a memory cell array which uses a nanogap element as a memory element, for example, the memory cell array which is obtained by replacing a capacitor of a DRAM memory cell with the nanogap element and driven by a method similar to that for the DRAM memory can be considered.

However, since the nanogap element needs high voltage for writing the data, only by replacing the capacitor of the DRAM memory with the nanogap element and driving it by a method similar to that for the DRAM memory cell array, there is a problem that an area of a high withstand voltage type (high voltage type) transistor occupies a great part of a layout of the memory cell array and its peripheral circuits, and it would penalize a miniaturization of the memory cell array.

In addition, only by replacing the capacitor of the DRAM memory with the nanogap element and driving it by a method similar to that for the DRAM memory cell array, it is impossible to separate high voltage system circuits from low voltage system circuits. As a result, there is a problem that designing or manufacturing the memory cell array or its peripheral circuits becomes complicated and cumbersome.

SUMMARY OF THE INVENTION

It is an object of the present invention to provide a memory cell array which is favorable for its miniaturization and can be easily designed and/or manufactured.

According to a first aspect of the invention, there is provided a memory cell array in which a plurality of memory cells are arranged in an array, the memory cell array including: a plurality of word lines respectively connected to the plurality of memory cells; a plurality of first bit lines respectively connected to the plurality of memory cells; and a plurality of second bit lines connected to the plurality of memory cells, wherein each of the memory cells includes: a metal-oxide semiconductor (MOS) transistor; and a switching element which is formed inside a contact hole including a first electrode connected to a first diffusion layer of the MOS transistor, wherein the switching element includes: a first conductive layer; a second conductive layer provided above the first conductive layer; and a gap having a size of nanometer order which is formed between the first conductive layer and the second conductive layer, and in which gap a phenomenon that a resistance value is changed by application of a predetermined voltage between the first conductive layer and the second conductive layer occurs, wherein each of the word lines is connected to a gate electrode of the MOS transistor, wherein each of the first bit lines is connected to a second electrode connected to a second diffusion layer of the MOS transistor, wherein each of the second bit lines is connected to the second conductive layer, and wherein data is written by specifying one or more of the first bit lines connected to one or more of the selected memory cells to connect the one or more first bit lines to a ground, specifying one or more of the word lines connected to the one or more memory cells, and supplying a write voltage to the one or plurality of second bit lines, wherein data is read by specifying the one or more word lines connected to the one or more selected memory cells, and specifying the one or more first bit lines connected to the one or more memory cells to supply a read voltage which is lower than the write voltage to the one or more first bit lines, and wherein when the data is written or read, the one or more word lines are specified by allowing the voltage of the one or more word lines to be a gate threshold value voltage of the MOS transistor or more and to be a sum of a drive voltage of a circuit for specifying the one or more first bit lines and the gate threshold value voltage or less.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DETAILED DESCRIPTION OF THE PREFERRED EMBODIMENTS

The best mode for carrying out the present invention will be explained below with reference to the drawings. The scope of the invention is not limited to illustrated examples.

First Embodiment

Firstly, a memory cell array 10 according to the first embodiment will be described.

Figure 1:
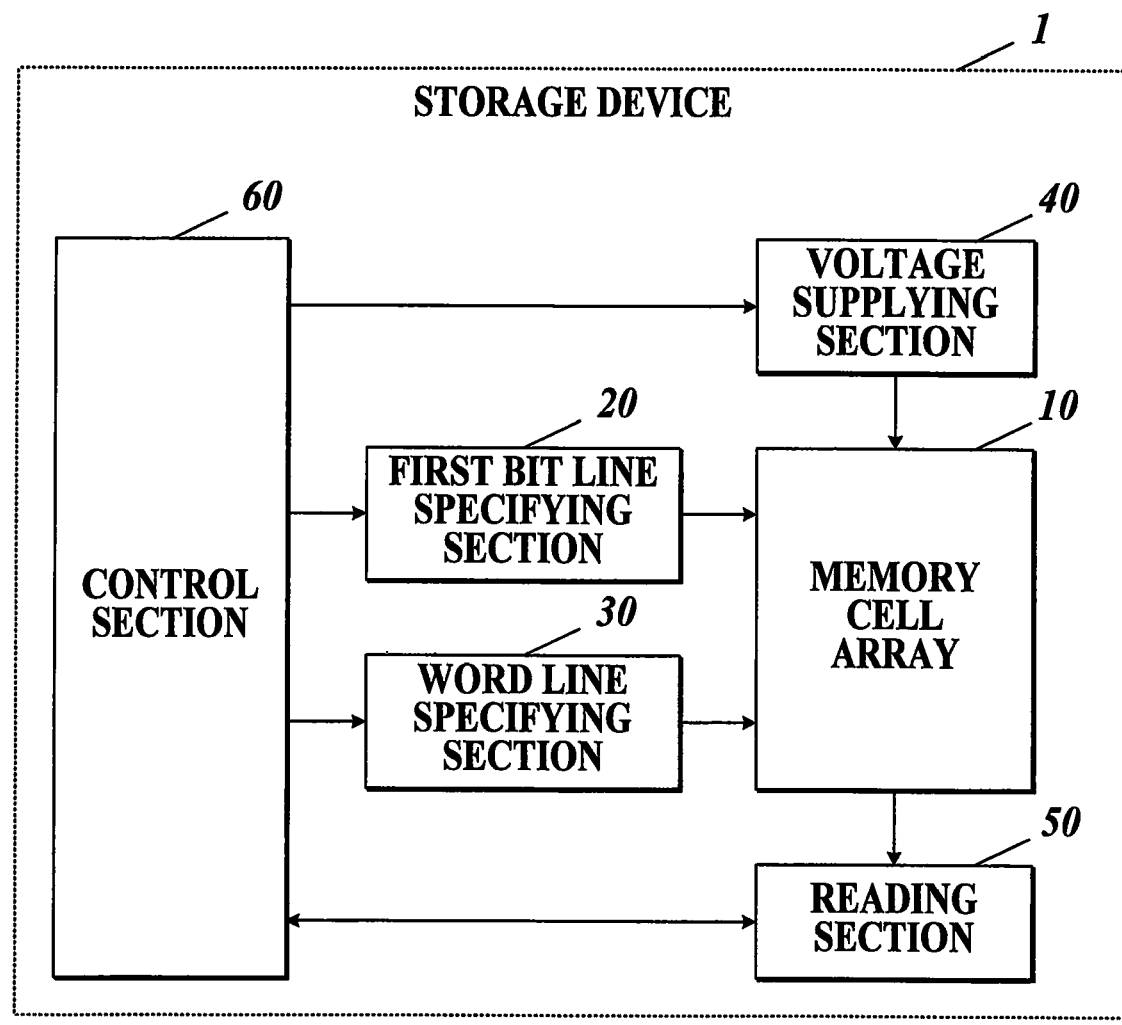
FIG. 1 is a block diagram showing an example of a functional configuration of a storage device equipped with a memory cell array according to a first embodiment.
Figure 2:
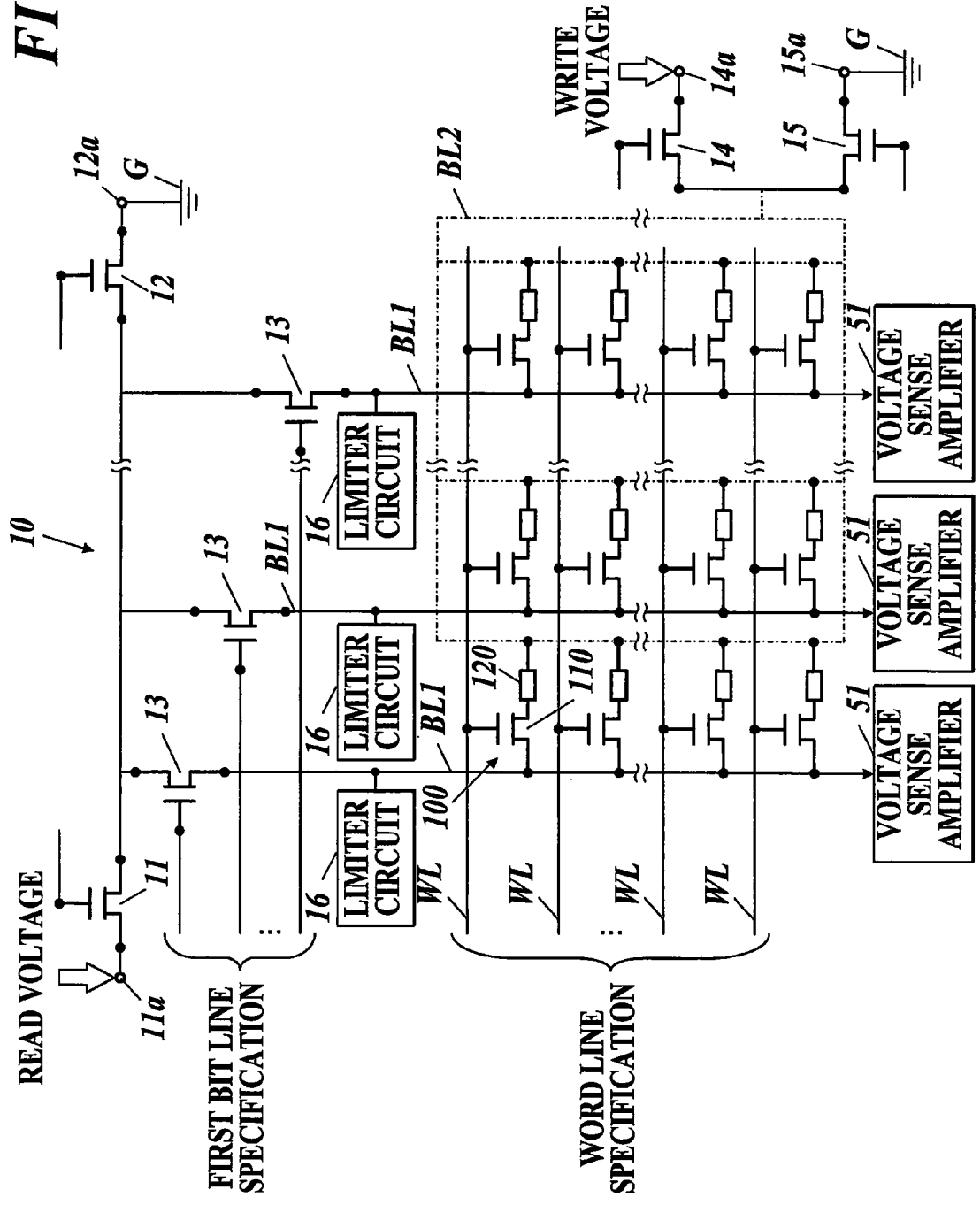
FIG. 2 is a circuit diagram showing an example of a configuration of main parts of the memory cell array according to the first embodiment.
Figure 3:
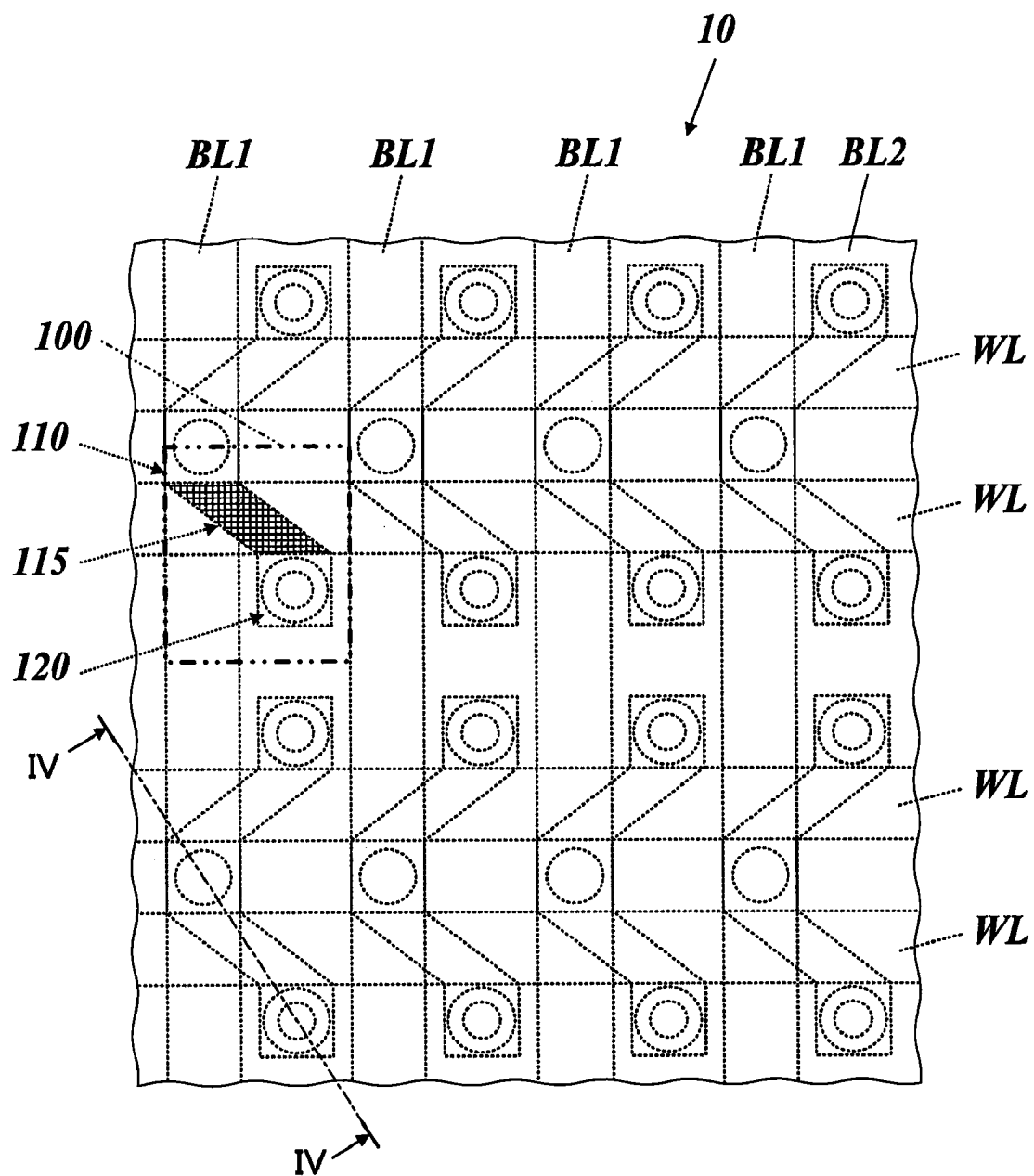
FIG. 3 is a plain diagram showing an example of a configuration of main parts of the memory cell array according to the first embodiment.
Figure 4:
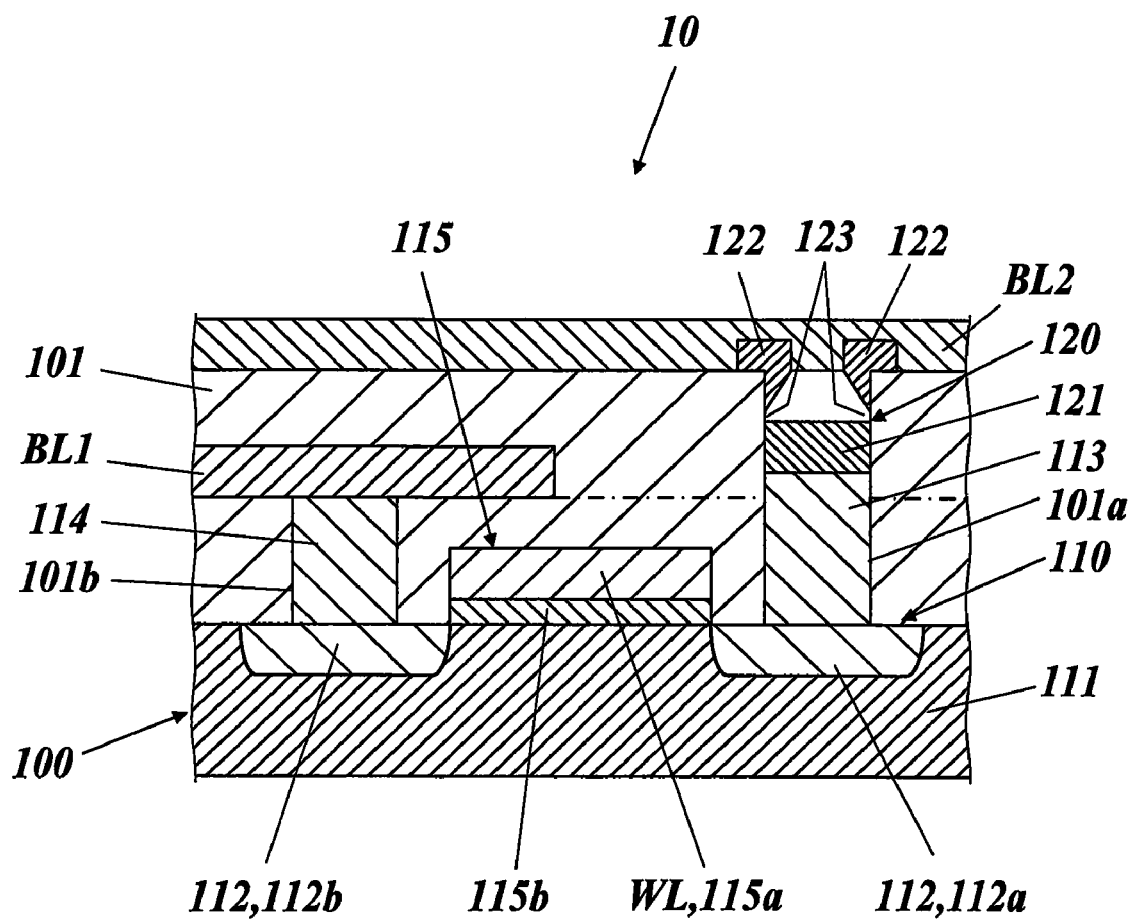
FIG. 4 is a cross-section diagram schematically showing an example of a cross-section along a line IV-IV of FIG. 3.
Figure 5:
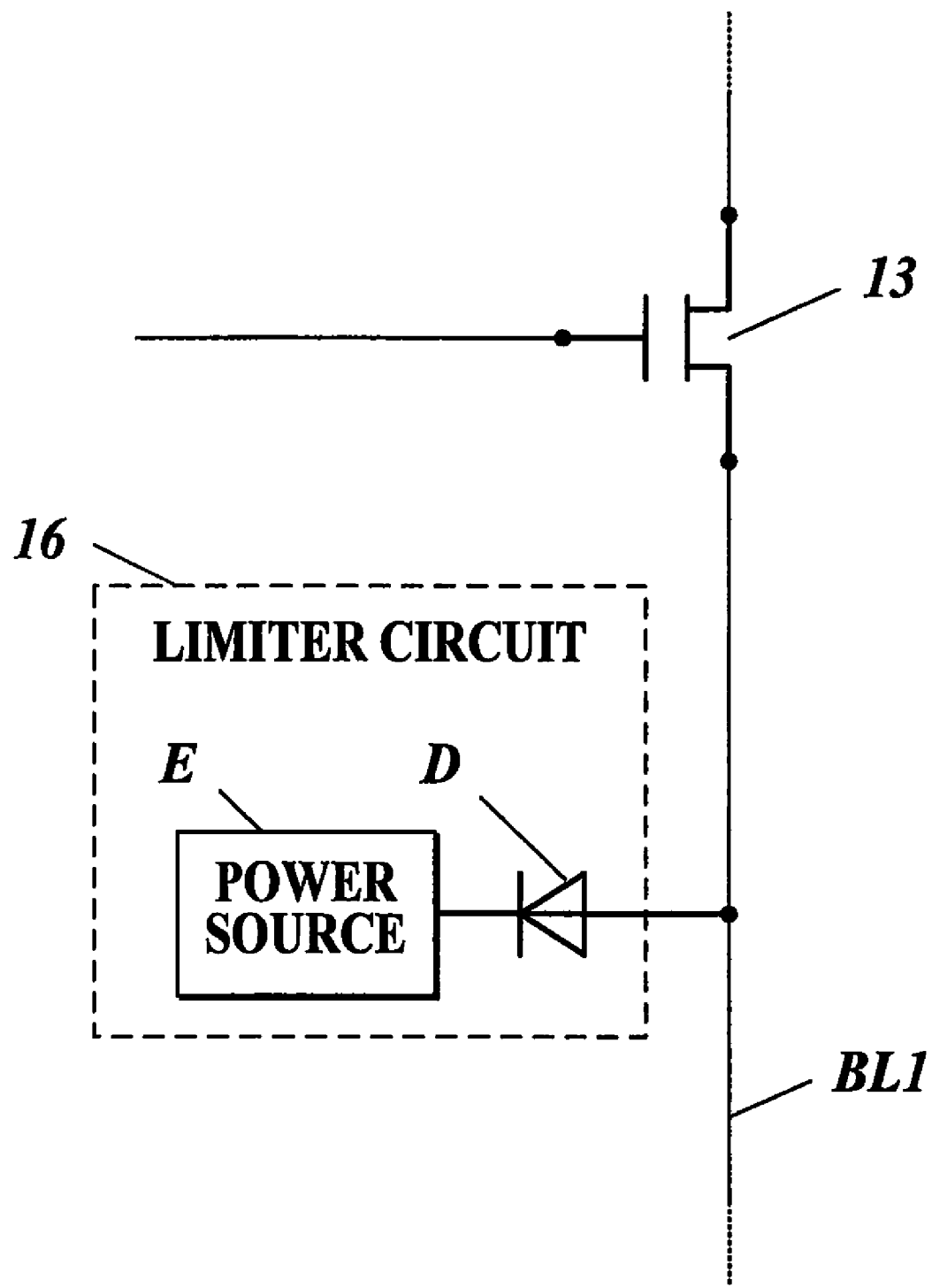
FIG. 5 is a circuit diagram showing an example of a configuration of a limiter circuit included in the memory cell array according to the first embodiment.

FIG. 1 is a block diagram showing an example of a functional configuration of a storage device 1 including the memory cell array 10. FIG. 2 is a circuit diagram showing an example of a configuration of main parts of the memory cell array 10, and FIG. 3 is a plain diagram showing an example of a configuration of main parts of the memory cell array 10. FIG. 4 is a cross-section diagram schematically showing an example of a cross-section along a line IV-IV of FIG. 3. FIG. 5 is a circuit diagram showing an example of a limiter circuit 16 included in the memory cell array 10.

A region enclosed within a chain double-dashed line in FIG. 3 is one memory cell 100 among a plurality of memory cells 100 included in the memory cell array 10, and a shaded region in FIG. 3 is a gate region 115 of a MOS transistor 110 of one memory cell 100 among the plurality of memory cells 100 included in the memory cell array 10.

(Storage Device)

The storage device 1 is a nonvolatile semiconductor storage device (nonvolatile Random Access Memory (RAM)) capable of reading, writing and deleting data, which device is equipped with the memory cell array 10 where the plurality of memory cells 100 are arranged in an array.

Specifically, as shown in FIG. 1 for example, the storage device 1 is configured to include the memory cell array 10, a first bit line specifying section 20, a word line specifying section 30, a voltage supplying section 40, a reading section 50, a control section 60, and so on.

(Memory Cell Array)

The memory cell array 10 is, for example, a high density memory where the plurality of memory cells 100 are arranged in an array (for example, two-dimentional array).

For example, as shown in FIGS. 2-4, the memory cell array 10 is configured to include: the memory cells 100 each of which contains a MOS transistor 110 as a selection element and a nanogap element 120 as a memory element connected to the MOS transistor 110 in series; a plurality of word lines WL, a plurality of first bit lines BL1, and a second bit line BL2, which are respectively connected to the plurality of memory cells 100; a first transistor 11 which functions as a switch connected to the plurality of first bit lines BL1; a second transistor 12 which functions as a switch connected to the plurality of first bit lines BL1; a plurality of third transistors 13 which function as switches respectively connected to the plurality of first bit lines BL1; a fourth transistor 14 which functions as a switch connected to the second bit line BL2; a fifth transistor 15 which functions as a switch connected to the second bit line BL2; a plurality of limiter circuits 16 respectively connected to the plurality of first bit ones BL1, and so on.

In other words, each of the memory cells 100 included in the memory cell array 10 has a configuration where a capacitor of the memory cell included in the DRAM memory cell array is replaced with the nanogap element 120 as shown in FIG. 4 for example.

Figure 8:
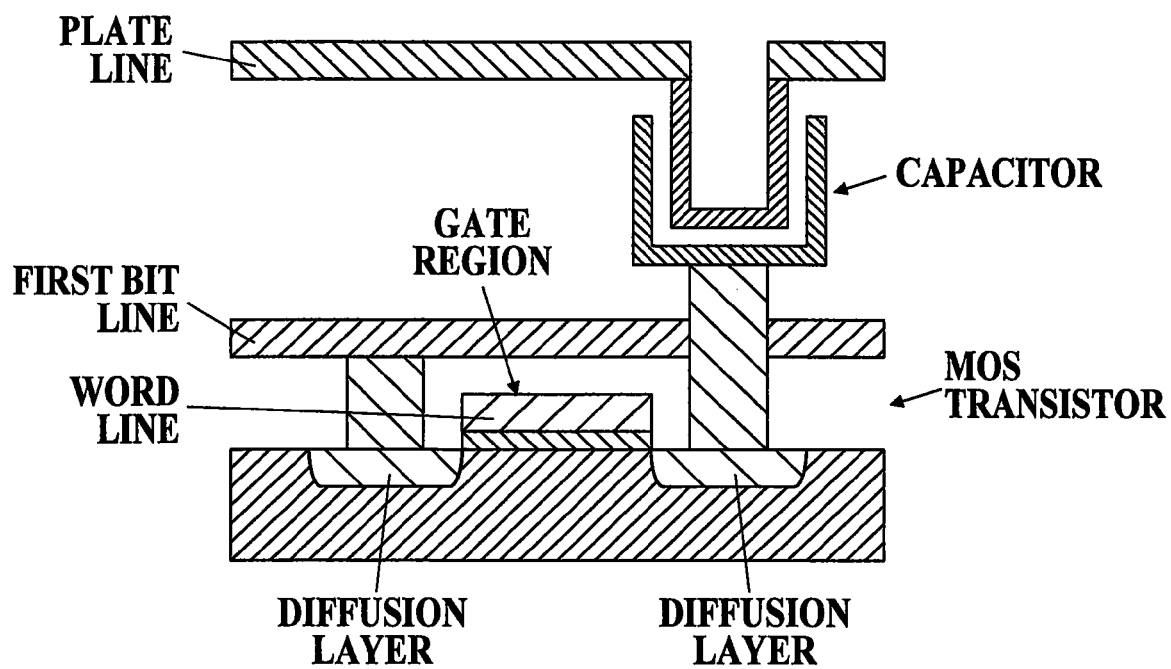
FIG. 8 is a diagram schematically showing an example of a cross-section of a conventional memory cell.

The nanogap element 120 is formed inside a contact hole 101a which includes a first electrode 113 connected to a first diffusion layer 112a of the MOS transistor 110. Since the memory element (the nanogap element 120) included in the memory cell array 10 is smaller than the memory element (capacitor) included in the DRAM memory cell array as shown in FIGS. 4 and 8 for example, the memory cell array 10 can be downsized more than the DRAM memory cell array.

A cell configuration of each of the memory cells 100 is $6F^2$ configuration of 3F×2F as shown in FIG. 3, for example. F is a value (namely, feature size) which gives an indication of minimum feature size used in a semiconductor device.

As shown in FIG. 4 for example, the MOS transistor 110 is configured to include: a semiconductor substrate 111; the diffusion layers 112, 112 which are formed on a surface of the semiconductor substrate 111 and have high impurity densities; the first electrode 113 (for example, metal electrode) which is provided inside the contact hole 101a formed in an insulation layer 101 and connected to the semiconductor substrate 111 through the first diffusion layer 112a; a second electrode 114 (for example, metal electrode) which is provided inside the contact hole 101b formed in the insulation layer 101 and connected to the semiconductor substrate 111 through the second diffusion layer 112b; the gate region 115 composed of a gate electrode 115a (for example, polysilicon electrode) and a gate insulation film 115b (for example, $SiO_2$ film) which is formed between the first diffusion layer 112a and a second diffusion layer 112b on the semiconductor substrate 111, and so on.

The nanogap element 120 is a memory element to switch a resistance status between nanogap electrodes (in a gap included in a gap section 123) to store data, for example.

The nanogap element 120 is formed on the first electrode 113 which is provided inside the contact hole 101a and on the first diffusion layer 112a of the MOS transistor 110, for example.

Specifically, as shown in FIG. 4 for example, the nanogap element 120 is configured to include: a first conductive body 121 provided on the first electrode 113; a second conductive body 122 provided above the first conductive body 121; the gap section 123 which is formed between the first conductive body 121 and the second conductive body 122 and which contains a gap having a size of nanometer order where a phenomenon that a resistance value is changed by application of a predetermined voltage between the first conductive body 121 and the second conductive body 122 occurs, and the like.

The shape of the first conductive body 121 is not specifically limited as long as the first conductive body 121 is connected to the first electrode 113. For example, as shown FIG. 4, the first conductive body 121 is formed so as to cover an upper surface of the first electrode 113.

The material of the first conductive body 121 is not especially limited, and preferably at least one selected from gold, silver, platinum, palladium, nickel, aluminum, cobalt, chrome, rhodium, copper, tungsten, tantalum, carbon, and alloy thereof, for example.

The shape of the second conductive body 122 is not specifically limited as long as the second conductive body 122 is provided above the first conductive body 121 and connected to the second bit line BL2. For example, as shown in FIG. 4, the second conductive body 122 is formed within an area from a part of an inner wall of the contact hole 101a to an open edge section of the contact hole 101a.

The material of the second conductive body 122 is not specifically limited, and preferably at least one selected from gold, silver, platinum, palladium, nickel, aluminum, cobalt, chrome, rhodium, copper, tungsten, tantalum, carbon, and alloy thereof, for example.

Here, in the nanogap element 120, the phenomenon that the resistance value is changed occurs when a voltage value of the voltage to be applied between the first conductive body 121 and the second conductive body 122 is higher than a predetermined threshold value, and the phenomenon that the resistance value is changed does not occur when the voltage value of the voltage to be applied between the first conductive body 121 and the second conductive body 122 is lower than the predetermined threshold value.

Therefore, a voltage value of a write voltage to be supplied when the data is written in the memory cell 100 (the nanogap element 120) is a value selected from a range higher than the predetermined threshold value, and a voltage value of a read voltage to be supplied when the data is read from the memory cell 100 is a value selected from a range lower than the predetermined threshold value.

Each of the word lines WL is formed in a line shape for example, and the word lines WL are arranged in parallel with one another on the semiconductor substrate 111, for example.

In this embodiment, the gate electrode 115a of the MOS transistor 110 also has a function of each of the word lines WL. In other words, each of the word lines WL is provided on the semiconductor substrate 111 via the gate insulation film 115b, and a part which includes each of the word lines WL and the gate insulation film 115b and is between the first diffusion layer 112a and the second diffusion layer 112b is the gate region 115 of the MOS transistor 110. Thus, a predetermined region (a portion between the first diffusion layer 112a and the second diffusion layer 112b) of each of the word lines WL composes the gate region 115, and thereby each of the word lines WL is connected to the gate electrode 115a.

One or more of the word lines WL are specified by applying the predetermined voltage thereto. The predetermined voltage is a gate threshold value voltage (Vth) of the MOS transistor 110 or more, and it is a sum (Vlow+Vth) of a drive voltage (Vlow) of a circuit (address circuit) for specifying one or more of the first bit lines BL1 and the gate threshold value voltage or less.

In other words, when writing the data in the one or more memory cells 100 and/or when reading the data from the one or more memory cells 100, the voltage of one or more word lines WL connected to the one or more memory cells 100 becomes the predetermined voltage.

Incidentally, the voltage value of the predetermined voltage to be applied to the one or more word lines WL at the time of writing the data may be same as or different from the voltage value of the predetermined voltage to be applied to the one or more word lines WL at the time of reading the data.

As described later, the write voltage which is a high voltage (Vpp) is supplied to the second bit line BL2, and the read voltage which is a low voltage (Vcc) is supplied to the one or more of first bit lines BL1.

The voltage of the word lines WL does not become larger than the sum of the drive voltage of the address circuit for specifying the one or more first bit lines BL1 and the gate threshold value voltage. Thus, also a voltage of the gate electrode 115a of the MOS transistor 110 connected to each of the word lines WL does not becomes larger than the sum of the drive voltage and the gate threshold value voltage, and the voltage of the first bit lines BL does not larger than the drive voltage.

Since the read voltage is a low voltage and also the drive voltage of the address circuit for specifying the one or more first bit lines BL1 can be a low voltage, the voltage of the first bit lines BL1 can be a low voltage. Therefore, it becomes possible to allow a second diffusion layer 112b side of the MOS transistor 110 connected to each of the first bit lines BL1, the first transistor 11, the second transistor 12 and each of the third transistors 13 to be a low voltage system, and to separate the low voltage system circuits from high voltage system circuits (a first diffusion layer 112a side of the MOS transistor 110 connected to the second bit line BL2, the fourth transistor 14 and the fifth transistor 15).

Since the second diffusion layer 112b side of the MOS transistor can be the low voltage system, only the first diffusion layer 112a side needs to have a high voltage withstanding characteristics, and the second diffusion layer 112b side does not need to have a high voltage withstanding characteristics. Moreover, since also the first transistor 11, the second transistor 12 and the third transistor 13 can be the low voltage system, only the fourth transistor 14 and the fifth transistor 15 need to have a high voltage withstanding characteristics, and the first transistor 11, the second transistor 12 and the third transistor 13 do not need to have a high voltage withstanding characteristics. Thus, in the layout of the memory cell array 110, an area occupied by the second diffusion layer 112b may be narrower than that of the first diffusion layer 112a, and an area occupied by the first transistor 11, the second transistor 12 and the third transistor 13 may be narrower than that of the fourth transistor 14 and the fifth transistor 15. This facilitates a miniaturization.

Furthermore, since the voltage of the first bit lines BL1 can be a low voltage, peripheral circuits and other driving circuits for driving the memory cell array 10 can be clearly divided into: the address circuit for specifying the one or more first bit lines BL1 and the low voltage system circuits connected thereto; and the high voltage system circuits necessary for writing the data, while allowing the first bit lines BL1 and the second bit line BL2 to be a boundary thereof. This facilitates a miniaturization of an area of the peripheral circuits for driving the memory cell array 10, and design/manufacture of the peripheral circuits/patterns.

Each of the first bit lines BL1 is formed in a line shape at a position upper than each of the word lines WL for example, and the first bit lines BL1 are arranged in parallel with one another so as to be perpendicular to the word lines WL.

Each of the first bit lines BL1 is connected to the second electrode 114 which is connected to the second diffusion layer 112b of the MOS transistor 110, for example.

As shown in FIG. 2 for example, one end portion of each of the first bit lines BL1 is connected to a read voltage terminal 11a to which the read voltage is supplied through each of the limiter circuits 16, each of the third transistors 13 and the first transistor 11, and connected to a ground terminal 12a through each of the limiter circuits 16, each of the third transistors 13 and the second transistor 12. The other end portion is connected to each of voltage sense amplifiers 51 included in the reading section 50.

One end potions of the first bit lines BL1 are respectively connected to the third transistors 13 through the limiter circuits 16 as limiting members to limit the voltage of the first bit lines BL1 to the drive voltage of the address circuit for specifying the one or more first bit line BL1 or less.

Specifically, as shown in FIG. 5 for example, each of the limiter circuits 16 includes a power source E, a diode D one end of which is connected to the power source E and the other end of which is connected to each of the first bit lines BL1, and so on.

Incidentally, a voltage for turning on a source voltage of the power source E or the diode D is arbitrary as long as it can limit the voltage of the first bit lines BL1 to the drive voltage or less.

Therefore, since the voltage of the first bit lines BL1 does not become larger than the drive voltage of the address circuit for specifying the one or more first bit lines BL1 even when a surge voltage is applied to the first bit lines for example, the second diffusion layer 112b side of the MOS transistor 110, the first transistor 11, the second transistor 12 and each of the third transistors 13 which are connected to each of the first bit lines BL1 are free from worry about improper operating or breakage even when they are made as the low voltage system, and safety is ensured.

Furthermore, since the voltage of the first bit lines BL1 does not become larger than the drive voltage, also the address circuit for specifying the one or more first bit lines BL1 and the low voltage system circuits connected thereto are free from worry about improper operating or breakage, and safety is ensured.

The second bit line BL2 is formed at a position above the first bit lines BL1, parallel to the first bit lines BL1, and in a plain shape, for example. Specifically, as shown in FIGS. 3 and 4 for example, the second bit line BL2 covers approximately a whole upper surface of the insulation layer 101 (second insulation layer) and is connected to the second conductive layer 122 of the nanogap element 120. In other words, for example, approximately a whole upper surface of the memory cell array 10 is composed of the second bit line BL2.

Thus, since the second bit line BL2 is not formed into a line shape, the second bit line BL2 is shown by a virtual line (dashed line) in FIG. 2.

One end of the second bit line BL2 is, as shown in FIG. 2 for example, connected to a write voltage terminal 14a to which the write voltage is supplied through the fourth transistor 14, and connected to a ground terminal 15a through the fifth transistor 15.

Next, an example of a method for manufacturing the memory cell array 10 will be described.

The memory cell array 10 is manufactured by the steps of: (a) producing the semiconductor substrate 111 of the MOS transistor 110 on a substrate (not shown) of the memory cell array 10; (b) forming the diffusion layers 112a, 112b on the surface of the semiconductor substrate 111; (c) producing the gate insulation film 115b on the semiconductor substrate 111; (d) producing the word lines WL (the gate electrodes 115a) on the gate insulation film 115b; (e) producing the insulation film 101 (first insulation layer) which covers the semiconductor substrate 111 (including the diffusion layers 112a, 112b), the gate insulation film 115b and the word lines WL (gate electrodes 115a) on the semiconductor substrate 111; (f) forming the contact hole 101b in the first insulation layer; (g) producing the second electrode 114 on the second diffusion layer 112b and inside the contact hole 101b; (h) producing the first bit lines BL1 each of which is connected to the second electrode 114 on the first insulation layer; (i) producing the insulation layer 101 (second insulation layer) which covers the first insulation layer and the first bit lines BL1 on the first insulation layer; (j) forming the contact hole 101a in the first insulation layer and the second insulation layer; (k) producing the first electrode 113 on the first diffusion layer 112a and inside the contact hole 101a; (l) producing the first conductive body 121 of the nanogap element 120 on the first electrode 113 and inside the contact hole 101a; (m) producing the second conductive body 122 of the nanogap element 120 above the first conductive body 121; and (n) producing the second bit line BL2 which covers approximately a whole upper surface of the second insulation layer and is connected to the second conductive body 122, for example.

For producing patterns of the word lines WL, the first bit lines BL1, the second bit line BL2, the conductive bodies (the first conductive body 121 and the second conductive body 122) of the nanogap element 120 and the like, optical lithography, electron beam lithography, dry etching, wet etching, liftoff, Chemical Vapor Deposition (CVD), Physical Vapor Deposition (PVD), Chemical Mechanical Polishing (CMP) and the like can be used, for example.

The above-mentioned method for manufacturing the memory cell array 10 is just one example, and the method of the present invention is not limited to the above.

(First Bit Line Specifying Section)

The first line specifying section 20 is composed of the address circuit for specifying the one or more first bit lines BL1, and the like. When address information concerning a location of the one or more of first bit lines BL is input from the control section 60 for example, the first line specifying section 20 determines the one or more first bit lines BL1 specified by the control section 60 based on the address information to switch the one or more third transistors 13 connected to the one or more first bit lines BL1 to ON state (conduction state) so as to specify the one or more of first bit lines BL1.

(Word Line Specifying Section)

When the address information concerning a location of one or more word lines WL is input from the control section 60 for example, the word line specifying section 30 determines the one or more word lines WL specified by the control section 60 based on the address information to supply (apply) a predetermined voltage to the one or more word lines to specify the one or more word lines WL.

In other words, the word line specifying section 30 specifies the one or more word lines WL by allowing them to be the predetermined voltage.

(Voltage Supplying Section)

When the control section 60 instructs to supply the write voltage for example, the voltage supplying section 40 switches the second transistor 12 and the fourth transistor 14 which are included in the memory cell array 10 to ON state (conduction state) to supply (apply) the write voltage to the second bit line BL2.

Moreover, when the control section 60 instructs to supply the read voltage for example, the voltage supplying section 40 switches the first transistor 11 and the fifth transistor 15 included in the memory cell array 10 to ON state (conduction state) to supply (apply) the read voltage to the one or more first bit lines BL1.

(Reading Section)

The reading section 50 contains the plurality (for example, the same number as that of the first bit lines BL1) of voltage sense amplifiers 51, for example.

When the control section 60 instructs to turn on one or more of the voltage sense amplifiers 51 for example, the reading section 50 turns on the one or more voltage sense amplifiers 51, and detects by the voltage sense amplifiers 51 the voltage of the one or more first bit lines BL1 connected to the one or more voltage sense amplifiers 51 to amplify the voltage. Then, the reading section 50 judges the data based on the amplified voltage to output the judgment result to the control section 60.

(Control Section)

The control section 60 is configured to include a Central Processing Unit (CPU), Read Only Memory (ROM), Random Access Memory (RAM), and the like for example, and performs a centralized control of each section of the storage device 1.

(Writing Processing)

Next, an example of processing concerning data writing to one or more memory cells 100 by the storage device 1 will be described.

The control section 60 writes the data in the one or more memory cells 100 by specifying the one or more first bit lines BL1 connected to the one or more selected memory cells 100 to connect the one or more first bit lines BL1 to the ground G, specifying the one or more word lines WL connected to the one or more memory cell 100, and supplying the write voltage to the second bit line BL2.

Specifically, the control section 60 outputs the address information of the one or more first bit lines BL1 connected to the one or more selected memory cells 100 to the first bit line specifying section 20.

When the address information is input, the first bit line specifying section 20 switches the one or more third transistors 13 connected to the one or more first bit lines BL1 specified by the address information to ON state.

Then, the control section 60 outputs the address information of the one or more word lines WL connected to the one or more selected memory cells 100 to the word line specifying section 30.

When the address information is input, the word line specifying section 30 supplies a predetermined voltage to the one or more word lines WL specified by the address information.

Next, the control section 60 instructs the voltage supplying section 40 to supply the write voltage.

When it is instructed to supply the write voltage, the voltage supplying section 40 switches the second transistor 12 to ON state to connect the one or more first bit lines BL1 connected to the one or more third transistors 13 in ON state to the ground G, and switches the fourth transistor 14 to ON state to supply the write voltage to the second bit line BL2 through the write voltage terminal 14a.

Since the one or more first bit lines BL1 connected to the one or more memory cells 100 selected by the control section 60 are connected to the ground and the one or more word lines WL connected to the selected memory cells 100 are allowed to be the predetermined voltage, the MOS transistor 110 included in the one or more selected memory cells 100 is switched to ON state (conduction state) when the write voltage is supplied to the second bit line BL2, and a potential difference occurs between the write voltage terminal 4a and the ground G (the ground terminal 12a) via the one or more selected memory cells 100. The voltage is applied between the first conductive body 121 and the second conductive body 122 of the nanogap element 120 included in the one or more selected memory cells 100. As a result, a resistance state of the nanogap element 120 is switched from a low resistance state (for example, a resistance state corresponding to data "zero (0)") to a high resistance state (for example, a resistance state corresponding to data "one (1)") for example, and the data is written in the one or more selected memory cells 100 (the nanogap element 120).

Therefore, a voltage value of the write voltage needs to be a magnitude sufficient to switch the resistance state of the nanogap element 120. In other words, the voltage value of the write voltage is a value selected from a range higher than a predetermined threshold value, for example 10V for switching to the high resistance state, and 7V for switching to the low resistance state.

(Reading Processing)

Next, an example of processing concerning data reading from the one or more memory cells 100 by the storage device 1 will be described.

The control section 60 reads the data from the one or more memory cells 100 by specifying the one or more word lines WL connected to the one or more selected memory cells 100 and specifying the one or more first bit lines BL1 connected to the one or more memory cells 100 to supply a read voltage lower than the write voltage to the one or more first bit lines BL1.

Specifically, the control section 60 firstly outputs the address information of the one or more first bit lines BL1 connected to the one or more selected memory cells 100 to the bit line specifying section 20.

When the address information is input, the first bit line specifying section 20 switches the one or more third transistors 13 connected to the one or more first bit lines BL1 specified by the address information to ON state.

Then, the control section 60 instructs the voltage supplying section 40 to supply the read voltage.

When it is instructed to supply the read voltage, the voltage supplying section 40 switches the fifth transistor 15 to ON state to connect the second bit line BL2 to the ground G, and switches the first transistor 11 to ON state to supply the read voltage to the one or more first bit lines BL1 through the read voltage terminal 11a.

Next, the control section 60 outputs the address information of the one or more word lines WL connected to the one or more selected memory cells 100 to the word line specifying section 30.

When the address information is input, the word line specifying section 30 supplies a predetermined voltage to the one or more word lines WL specified by the address information.

Next, the control section 60 instructs the reading section 50 to turn on the one or more voltage sense amplifiers 51.

Since the one or more first bit lines BL1 connected to the one or more memory cells 100 selected by the control section 60 is specified and the read voltage is supplied to the one or more first bit lines BL1, the read voltage is supplied to the one or more specified first bit line BL1. In this state, when the voltage of the one or more word lines WL connected to the one or more selected memory cells 100 becomes the predetermined voltage, the MOS transistor 110 included in the one or more selected memory cells 100 is switched to ON state (conduction state), and a voltage depression depending on the resistance state of the nanogap element 120 included in the one or more selected memory cells 100 occurs in the one or more specified first bit lines BL1. In other words, the voltage depression is large when the resistance state of the nanogap element 120 is the low resistance state, and the voltage depression is small when it is the high resistance state. Thus, by detecting the voltage of the one or more specified first bit line BL1 with the one or more voltage sense amplifier 51 to determine the resistance state of the nanogap element 120, the data ("zero (0)" or "one (1)") is read from the one or more selected memory cells 100 (the nanogap element 120).

Therefore, a voltage value of the read voltage is arbitrary as long as it is a magnitude which is smaller than the voltage value of the write voltage and unenable to switch the resistance state of the nanogap element 120. In other words, the voltage of the read voltage is a value selected from a range lower than a predetermined threshold value, for example, 2V and the like.

According to the above-described memory cell array 10 of the first embodiment, the plurality of word lines WL, the plurality of first bit lines BL1, and the second bit line BL2 which are respectively connected to the plurality of memory cells 100 are provided, each of the memory cells 100 includes the MOS transistor 110 and the nanogap element 120 which includes the first electrode 113 connected to the first diffusion layer 112*a* of the MOS transistor 110 and formed inside the contact hole 101*a*, the nanogap element 120 includes the first conductive body 121, the second conductive body 122 provided above the first conductive body 121, and the gap section 123 including the gap having a size of nanometer order which is formed between the first conductive body 121 and the second conductive body 122 and in which the phenomenon that the resistance value is changed by application of a predetermined voltage between the first conductive body 121 and the second conductive body 122 occurs, each of the word lines WL is connected to the gate electrode 115*a* of the MOS transistor 110, each of the first bit line BL1 is connected to the second electrode 114 connected to the second diffusion layer 112*b* of the MOS transistor 110, and the second bit line BL2 is connected to the second conductive body 122. The memory cell array 10 is configured to write the data in the one or more memory cells 100 by specifying the one or more first bit lines BL1 connected to the one or more selected memory cells 100 to connect the one or more first bit lines BL1 to the ground G, specifying the one or more word lines WL connected to the one or more memory cells 100, and supplying the write voltage to the second bit line BL2. The memory cell array 10 is also configured to reads the data from the one or more memory cells 100 by specifying the one or more word lines WL connected to the one or more memory cells 100, and specifying the one or more first bit lines BL1 connected to the one or more memory cells 100 to supply the read voltage lower than the write voltage to the one or more first bit lines BL1. When writing or reading the data, the one or more word lines WL are specified by allowing the voltage of the word lines WL to be the gate threshold value voltage of the MOS transistor 110 or more and the sum of the drive voltage of the address circuit for specifying the one or more first bit lines BL1 and the gate threshold value voltage or less.

In other words, the write voltage as a high voltage is supplied to the second bit line BL2, and the read voltage as a low voltage is supplied to the one or more bit lines BL1.

Moreover, the voltage of the one or more word lines WL specified when writing or reading the data is the gate threshold value voltage of the MOS transistor 110 or more and the sum of the drive voltage of the address circuit for specifying the one or more first bit lines BL1 and the gate threshold value voltage or less. By this reason, the voltage of the gate electrode 115*a* of the MOS transistor 110 connected to the one or more word lines WL does not become larger than the sum, and the voltage of the first bit lines BL1 does not become larger than the drive voltage.

Since the read voltage is a low voltage and also the drive voltage can be a low voltage, the voltage of the first bit lines BL1 can be a low voltage. Since the second diffusion layer 112*b* side of the MOS transistor 110 connected to each of the first bit lines BL1, the first transistor 11, the second transistor 12 and the third transistor 13 can be a low voltage system, the first diffusion layer 112*a* side of the MOS transistor 110 connected to the second bit line BL2, the fourth transistor 14 and the fifth transistor 15 can be a high voltage system. As a result, the high voltage system circuits are separated from the low voltage system circuits, and thereby a design/manufacture of the memory cell array becomes easier.

Moreover, in the layout of the memory cell array, since the low voltage system circuits do not need high withstanding characteristics, its occupied area can be smaller than that of the high voltage system circuits. Therefore, even when the nanogap 120 which needs a high voltage for writing the data is used as a memory element, an area occupied by the second diffusion layer 112*b* side of the MOS transistor 110 connected to each of the first bit lines BL1, the first transistor 11, the second transistor 12 and the third transistor 13 can be smaller. This facilitates a miniaturization.

Furthermore, since the voltage of the first bit lines BL1 can be a low voltage, the peripheral circuits and other drive circuits for driving the memory cell array 10 can be divided into: the address circuits for specifying the one or more first bit lines BL1 and the low voltage system circuits subsequent thereto; and the high voltage system circuits necessary for writing the data, while allowing the first bit lines BL1 and the second bit line BL2 to be a boundary thereof. This facilitates a miniaturization of the peripheral circuit area for driving the memory cell array 10, and designing and manufacturing the peripheral circuits or patterns can be advantageously easier.

In addition, the memory cell array 10 has a configuration where a capacitor of a conventional memory cell array (DRAM memory cell array) is displaced with the nanogap element 120. The nanogap element 120 is suitable for a high-density configuration, because it is formed inside the contact hole 101*a*, smaller than the capacitor, and a vertical nanogap element 120 where the first conductive body 121 and the second conductive body 122 are arranged longitudinally (vertically) while the gap (the gap included in the gap section 123) having a size of nanometer order exists therebetween, in which gap the phenomenon (memory phenomenon of the resistance value) that the resistance value is changed occurs. Therefore, the memory cell array 10 can be downsized and its density can be increased, and conformity of the memory cell array 10 with an existing semiconductor technique is high.

According the first embodiment, the above-described memory cell array 10 further includes the limiter circuit 16 to limit the voltage of the first bit lines BL1 to the drive voltage of the address circuit for specifying the one or more first bit lines BL1 or less.

Therefore, even when the surge voltage is applied to the first bit lines BL1 for example, since the voltage of the first bit lines BL1 does not become larger than the drive voltage, the second diffusion layer 112*b* side of the MOS transistor 110, the first transistor 11, the second transistor 12 and the third transistor 13 which are connected to each of the first bit lines BL1 are free from worry about improper operating or breakage even when they are made as the low voltage system, and safety is ensured.

Furthermore, since the voltage of the first bit lines BL1 does not become larger than the drive voltage, also the address circuit for specifying the one or more first bit lines BL1 and the low voltage system circuits subsequent thereto are free from worry about improper operating or breakage, and safety is ensured.

According to the above-described memory cell array 10 of the first embodiment, the second bit line BL2 is formed into a plain shape wherein a plurality of bit lines each having a line shape are connected to one another.

Therefore, in the step of forming the second bit line BL2 in manufacturing the memory cell array 10, the second bit line BL2 can be formed more easily than the case of forming a plurality of bit lines each having a line shape.

Second Embodiment

Next, the memory cell array 10A according to the second embodiment will be described.

Figure 6:
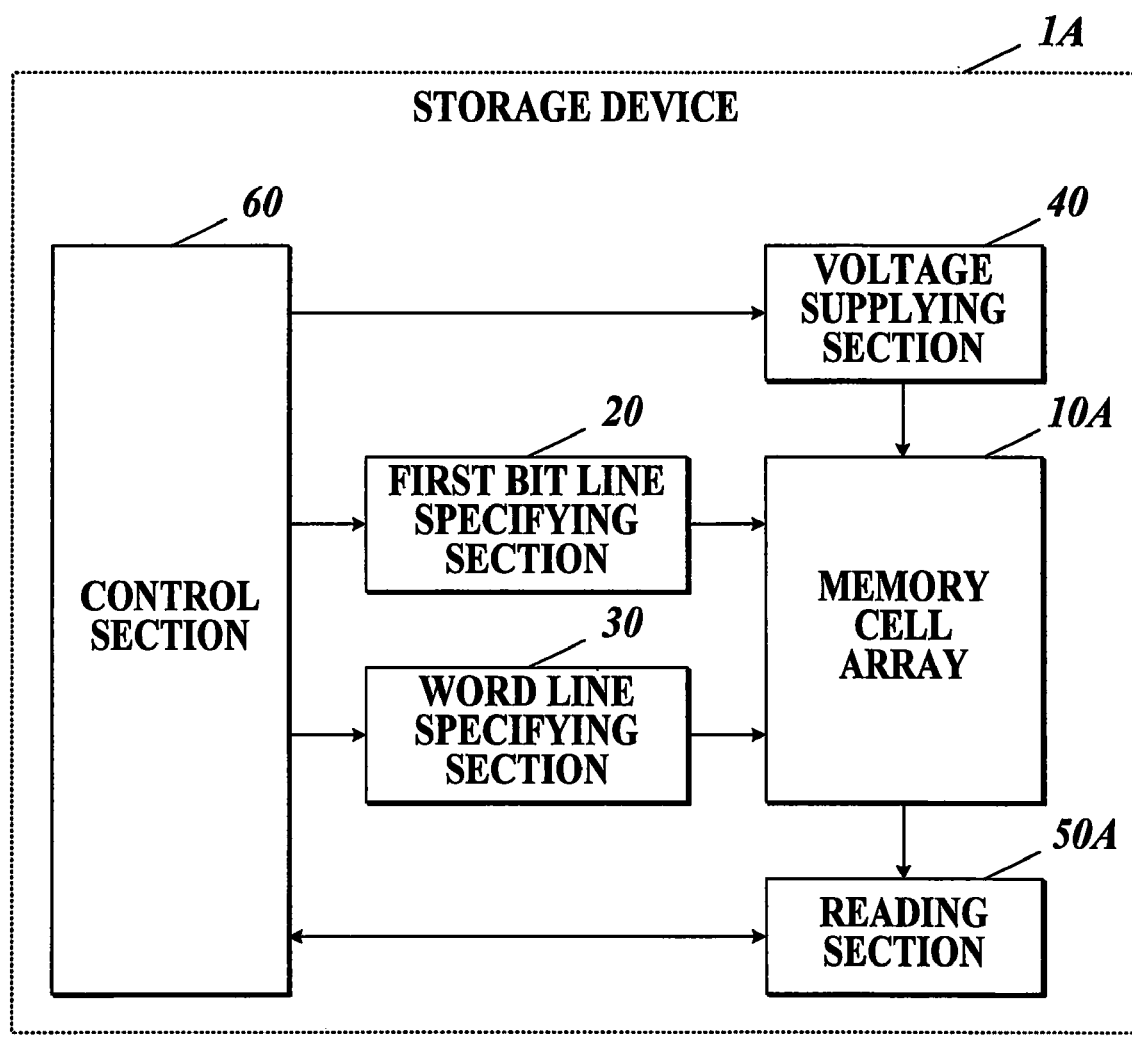
FIG. 6 is a block diagram showing an example of a functional configuration of a storage device equipped with a memory cell array according to a second embodiment.
Figure 7:
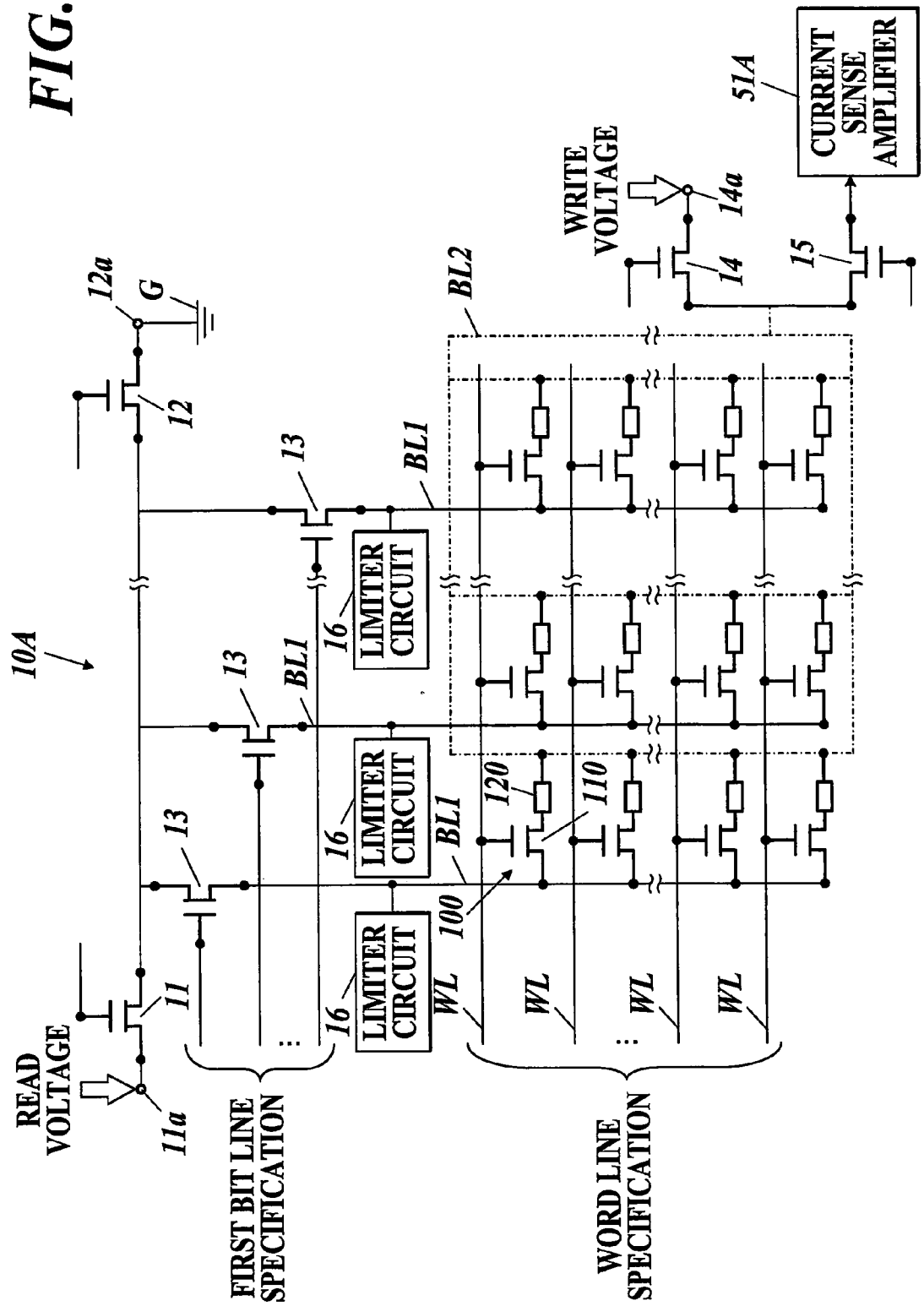
FIG. 7 is a circuit diagram showing an example of a configuration of main parts of the memory cell array according to the second embodiment.

FIG. 6 is a block diagram showing an example of a functional configuration of a storage device 1A provided with the memory cell array 10A. FIG. 7 is a circuit diagram showing an example of a configuration of main parts of the memory cell array 10A.

Incidentally, the memory cell array 10A of the second embodiment is different from the memory cell array 10 of the first embodiment in the point that the memory cell array 10A is connected to a current sense amplifier 51A instead of the voltage sense amplifiers 51. Thus, only different points will be described, and detailed descriptions of other common parts are omitted by putting same reference numbers.

One end of the second bit line BL2 is, as shown in FIG. 7 for example, connected to the write voltage terminal 14*a* through a fourth transistor 14A, and connected to the current sense amplifier 51A included in the reading section 50A through a fifth transistor 15.

Thus, since the second bit line BL2 is connected to the sense amplifier (the current sense amplifier 51A) in the second embodiment, the first bit lines BL1 are not connected to the sense amplifier (the voltage sense amplifier 51).
(Reading Section)

The reading section 50A contains one current sense amplifier 51A, for example.

When the control section 60 instructs to turn on the current sense amplifier 51A for example, the reading section 50A turns on the current sense amplifier 51A, and detects the current from the second bit line BL2A by the current sense amplifier 51A to amplify the current. Then, the reading section 50A judges the data based on the amplified current to output the judgment result to the control section 60.
(Writing Processing)

Next, an example of processing concerning data writing to the one or more memory cells 100 by the storage device 1A will be described.

The control section 60 writes the data in the one or more memory cells 100 by specifying the one or more first bit lines BL1 connected to the one or more selected memory cells 100 to connect the one or more first bit lines BL1 to the ground G, specifying the one or more word lines WL connected to the one or more memory cells 100, and supplying the write voltage to the second bit line BL2.

Specifically, the control section 60 firstly outputs the address information of the one or more first bit lines BL1 connected to the one or more selected memory cells 100 to the first bit line specifying section 20.

When the address information is input, the first bit line specifying section 20 switches the one or more third transistors 13 connected to the one or more first bit lines BL1 specified by the address information to ON state.

Then, the control section 60 outputs the address information of the one or more word lines WL connected to the one or more selected memory cells 100 to the word line specifying section 30.

When the address information is input, the word line specifying section 30 supplies a predetermined voltage to the one or more word lines WL specified by the address information.

Next, the control section 60 instructs the voltage supplying section 40 to supply the write voltage.

When it is instructed to supply the write voltage, the voltage supplying section 40 switches the second transistor 12 to ON states to connect the one or more first bit lines BL1 connected to the one or more third transistors 13 in ON state to the ground G, and switching the fourth transistor 14 to ON state to supply the write voltage to the second bit line BL2 through the write voltage terminal 14*a*.

Since the one or more first bit lines BL1 connected to the one or more memory cells 100 selected by the control section 60 are connected to the ground G and the voltage of the one or more word lines WL connected to the selected memory cells 100 becomes the predetermined voltage, when the write voltage WL is supplied to the second bit line BL2, the MOS transistor 110 included in each of the one or more selected memory cells 100 becomes ON state, and potential difference occurs between the write voltage terminal 14*a* and the ground G (the ground terminal 12*a*) across the selected memory cells 100. Thus, the voltage is applied between the first conductive body 121 and the second conductive body 122 of the nanogap element 120 included in each of the one or more selected memory cells 100, the resistance state of the nanogap element 120 switches from a low resistance state (for example, a resistance state corresponding to the data "zero (0)") to a high resistance state (for example, a resistance state corresponding to the data "one (1)"), and thereby the data is written in the selected memory cells 100 (the nanogap element 120).

Therefore, the voltage value of the write voltage needs to be a magnitude sufficient to switch the resistance state of the nanogap element 120. In other words, the voltage value of the write voltage is a value selected from a range higher than a predetermined threshold, for example, 10V for the high resistance state, and 7V for the low resistance state.
(Reading Processing)

Next, an example of processing concerning data reading from the one or more memory cells 100 by the storage device 1A will be described.

The control section 60 reads the data from the one or more memory cells 100 by specifying the one or more word lines WL connected to the one or more selected memory cells 100, and by specifying the one or more first bit lines BL1 connected to the one or more memory cells 100 to supply the read voltage lower than the write voltage to the one or more first bit lines BL1.

Specifically, the control section 60 firstly outputs the address information of the one or more first bit lines BL1 connected to the one or more selected memory cells 100 to the first but line specifying section 20.

When the address information is input, the first bit line specifying section 20 switches the one or more third transistors 13 connected to the one or more first bit lines BL1 specified by the address information to ON state.

Then, the control section 60 instructs the voltage supplying section 40 to supply the read voltage.

When it is instructed to supply the read voltage, the voltage supplying section 40 switches the fifth transistor 15 to ON state to connect the second bit line BL2 to the current sense amplifier 51A, and switches the first transistor 11 to ON state to supply the read voltage to the one or more bit lines BL1 through the read voltage terminal 11*a*.

Next, the control section 60 outputs the address information of the one or more word lines WL connected to the one or more selected memory cells 100 to the word line specifying section 30.

When the address information is input, the word line specifying section 30 supplies a predetermined voltage to the one or more word lines WL specified by the address information.

Next, the control section 60 instructs the reading section 50A to turn on the current sense amplifier 51A.

Since the control section 60 specifies the one or more first bit lines BL1 connected to the one or more selected memory cells 100 and the read voltage is supplied to the one or more first but lines BL1, the read voltage is supplied to the one or more specified first bit line BL1. In this state, when the voltage of the one or more word line WL connected to the one or more selected memory cells 100 becomes the predetermined voltage, the MOS transistor 100 included in the one or more selected memory cells 100 is switched to ON state, and the current depending on the resistance state of the nanogap element 120 included in the one or more selected memory cells 100 flows from the read voltage terminal 12a to the current sense amplifier 51A through the selected memory cells 100. In other words, the current having a high current value flows when the resistance state of the nanogap element 120 is the low resistance state, and the current having a low current value flows in the high resistance state. Thus, by detecting the current from the second bit line BL2 with the current sense amplifier 51A to judge the resistance state of the nanogap element 120, the data ("zero (0)" or "one (1)") is read from the one or more selected memory cells 100 (the nanogap element 120).

Therefore, the voltage value of the read voltage is arbitrary as long as its magnitude is smaller than that of the write voltage, and unenable to switch the resistance state of the nanogap element 120. In other words, the voltage value of the read voltage is a value selected from a range lower than a predetermined threshold value, for example, 2V.

According to the memory cell array 10A of the second embodiment, needless to say the advantage same as that of the memory cell array 10 the first embodiment can be obtained, and in addition the current sense amplifier 51A is provided as a sense amplifier.

In other words, since the number of the provided sense amplifier can be one (1), in comparison with the memory cell array 10 of the first embodiment equipped with the voltage sense amplifiers 51, the number of the sense amplifiers may be reduced. As a result, costs for manufacturing the storage device 1A provided with the memory cell array 10A can be reduced.

Incidentally, the present invention is not limited to the above-described embodiment, and can be appropriately changed without departing from the spirit of the present invention.

Though the cell configuration of each of the memory cells 100 is $6F^2$ configuration in the first and second embodiments, the cell configuration is not limited to the above, and can be appropriately changed as someone thinks proper.

Although the gate electrode 115a of the MOS transistor 110 functions also as each of the word lines WL in the first and second embodiments, the configuration is not limited to the above, and the gate electrode 115a and each of the word lines WL may be separately formed, for example.

Moreover, though the second bit line BL2 is formed separately from the second conductive body 122 of the nanogap element 120 in the first and second embodiment, the configuration is not limited to the above, and they may be formed integrally so that the second conductive body 122 also functions as the second bit line BL2.

In the first and second embodiments, though the second bit line BL2 has the plain shape where all of the plurality of the bit lines each having a line shape are connected to one another, the shape of the second bit line BL2 is arbitrary as long as it is a plain shape where at least two bit lines each having a line shape among the plurality of bit lines are connected to each other.

Moreover, though the second bit line BL2 has the plain shape in the first and second embodiments, the shape is not limited to the above and may be a line shape similar to each of the first bit lines BL1. When forming the second bit line BL2 into a line shape, a configuration where each of a plurality of second bit lines BL2 has an independent shape, and each line BL2 is connected to the fourth transistor 14 or the fifth transistor 15, and a configuration where end portions of at least two second bit lines BL2 among the plurality of second bit lines BL2 join (are connected to) one another and the joined portions are connected to the fourth transistor 14 or the fifth transistor 15 may be adopted.

Although the first bit lines BL1 included in the memory cell array 10 are connected to the voltage sense amplifiers 51 of the same numbers as the first bit lines BL1 in the first embodiment, the configuration is not limited to the above, and a configuration where end portions on the voltage sense amplifier 51 side of at least two first bit lines BL1 among the plurality of first bit lines BL1 join one another, and the joined end portions are connected to one voltage sense amplifier 51 may be adopted, for example.

Moreover, though the number of each of the fourth transistor 14A, the current sense amplifier 51A, and the fifth transistor 15 which are connected to the memory cell array 10A is one (1) because the memory cell array 10A has one second bit line BL2 having a plain shape in the second embodiment, the number of each of the fourth transistor 14, the current sense amplifier 51A, and the fifth transistor 15 may be appropriately changed depending on the number of the second bit lines BL2A included in the memory cell array 10A as someone thinks proper. When the memory cell array 10A is provided with a plurality of second bit lines BL2 each having a plane or line shape for example, a configuration where end portions of at least two second bit lines BL2 among the plurality of second bit lines BL2 join one another, and the joined end portions are connected to the fourth transistor 14 and connected to the fifth transistor 15 (specifically, connected to the current sense amplifier 51A through the fifth transistor 15) may be adopted.

In the first and second embodiments, the limiting member is not limited to the limiter circuit 16 shown in FIG. 5, and it is arbitrary as long as the voltage of the first bit lines BL1 can be limited to the drive voltage of the circuit for specifying the one or more first bit lines or less.

Moreover, in the first and second embodiment, the memory cell arrays 10, 10A do not need to always include the limiting member.

In the reading operation, the voltage to be applied to the nanogap element 120 becomes a smaller voltage of two voltages: a voltage which occurs in the first bit lines BL1 (Vb2: a voltage calculated by subtracting the sum of the gate threshold value voltage of the first transistor 11 and the gate threshold value voltage of the third transistor 13 from the read voltage); and a voltage (Vg−Vth) calculated by subtracting the gate threshold value voltage (Vth) of the MOS transistor from the gate voltage (Vg: a predetermined voltage to be applied to one or more word lines WL) of the MOS transistor 110.

Therefore, though the voltage value of the read voltage is restricted to a magnitude (for example, 2V) which is smaller than the voltage value of the write voltage and which is not sufficient for switching the resistance state of the nanogap element 120 in the first and second embodiments, when Vg−Vth is a magnitude unable to switch the resistance state of the nanogap element 120, such restriction is unnecessary for the voltage value of the read voltage. The read voltage is arbitrary as long as it is a source voltage of the low voltage system circuit, and may be 5V and the like specifically.

In the first and second embodiments, through the resistance states of the nanogap element 120 are distributed into the "high resistance state" and the "low resistance state" and one memory cell 100 stores the binary data, the resistance states of the nanogap element 120 can be distributed also into three or more states depending on a magnitude of the value of the voltage applied between the first conduction body 121 and the second conduction body 122 of the nanogap element 120.

Therefore, in the memory cell array 10 of the present invention, by adjusting the voltage value of the write voltage to be supplied, one memory cell 100 can store multiple-valued data.

As described above, according to the present embodiment, there is provided a memory cell array in which a plurality of memory cells are arranged in an array, the memory cell array including: a plurality of word lines respectively connected to the plurality of memory cells; a plurality of first bit lines respectively connected to the plurality of memory cells; and a plurality of second bit lines connected to the plurality of memory cells, wherein each of the memory cells includes: a metal-oxide semiconductor (MOS) transistor; and a switching element which is formed inside a contact hole including a first electrode connected to a first diffusion layer of the MOS transistor, wherein the switching element includes: a first conductive layer; a second conductive layer provided above the first conductive layer; and a gap having a size of nanometer order which is formed between the first conductive layer and the second conductive layer, and in which gap a phenomenon that a resistance value is changed by application of a predetermined voltage between the first conductive layer and the second conductive layer occurs, wherein each of the word lines is connected to a gate electrode of the MOS transistor, wherein each of the first bit lines is connected to a second electrode connected to a second diffusion layer of the MOS transistor, wherein each of the second bit lines is connected to the second conductive layer, and wherein data is written by specifying one or more of the first bit lines connected to one or more of the selected memory cells to connect the one or more first bit lines to a ground, specifying one or more of the word lines connected to the one or more memory cells, and supplying a write voltage to the one or plurality of second bit lines, wherein data is read by specifying the one or more word lines connected to the one or more selected memory cells, and specifying the one or more first bit lines connected to the one or more memory cells to supply a read voltage which is lower than the write voltage to the one or more first bit lines, and wherein when the data is written or read, the one or more word lines are specified by allowing the voltage of the one or more word lines to be a gate threshold value voltage of the MOS transistor or more and to be a sum of a drive voltage of a circuit for specifying the one or more first bit lines and the gate threshold value voltage or less.

Preferably, the memory cell array further includes a limiting member to limit the voltage of the first bit lines to the drive voltage or less.

Preferably, at least two second bit lines among the second bit lines are connected to each other.

According to the present invention, the data is written in the one or more memory cells by specifying the one or more first bit lines connected to the one or more selected memory cells to connect the one or more bit lines to the ground, and specifying the one or more word lines connected to the one or more memory cells to supply the write voltage to the second bit line, and the data is read from the one or more memory cells by specifying the one or more word lines connected to the one or more selected memory cells, and by specifying the one or more first bit lines connected to the one or more memory cells to supply the read voltage lower than the write voltage to the one or more first bit lines. When writing or reading the data, the one or more word lines are specified by allowing the voltage of the word lines to be the gate threshold value voltage of the MOS transistor or more and at the same time to be the sum of the drive voltage of the circuit for specifying the one or more first bit lines and the gate threshold value voltage or less.

In other words, the write voltage which is the high voltage is supplied to the second bit line, and the read voltage which is the low voltage is supplied to the one or more first bit lines.

Moreover, the voltage of the one or more word lines specified when writing or reading the data is the gate threshold value voltage of the MOS transistor or more and is the sum of the drive voltage of the circuit for specifying the one or more first bit lines and the gate threshold value voltage or less. Therefore, the voltage of the gate electrode of the MOS transistor connected to each of the one or more first bit lines does not become larger than the sum, and the voltage of the one or more first bit lines does not become larger than the drive voltage.

Since the read voltage is the low voltage and the drive voltage of the circuit for specifying the one or more first bit lines can be the low voltage, the voltage of the first bit lines can be the low voltage. Thus, it is possible to allow the second diffusion layer side of the MOS transistor connected to each of the one or more first bit lines to be the low voltage system and to allow the first diffusion layer side of the MOS transistor connected to the second bit line to be the high voltage system so that the high voltage system circuits and the low voltage system circuits are separated from each other. As a result, memory cell array can be easily designed or manufactured.

Furthermore, since the low voltage system circuits do not need a high voltage withstanding, the occupied area thereof may be smaller than the high voltage system circuits in the layout of the memory cell array. Therefore, the occupied area of the second diffusion layer side of the MOS transistor which is the low voltage system can be small even when the nanogap element which needs a high voltage for writing the data is used as a memory element. This facilitates a miniaturization.

The entire disclosure of Japanese Patent Application No. 2008-334129 filed on Dec. 26, 2008 including description, claims, drawings, and abstract are incorporated herein by reference in its entirety.

What is claimed is:

1. A memory cell array in which a plurality of memory cells are arranged in an array, the memory cell array comprising:
   a plurality of word lines respectively connected to the plurality of memory cells;
   a plurality of first bit lines respectively connected to the plurality of memory cells; and
   a plurality of second bit lines connected to the plurality of memory cells,
   wherein each of the memory cells includes:
      a metal-oxide semiconductor (MOS) transistor; and
      a switching element which is formed inside a contact hole including a first electrode connected to a first diffusion layer of the MOS transistor,
   wherein the switching element includes:
      a first conductive layer;
      a second conductive layer provided above the first conductive layer; and
      a gap having a size of nanometer order which is formed between the first conductive layer and the second conductive layer, and in which gap a phenomenon that a resistance value is changed by application of a predetermined voltage between the first conductive layer and the second conductive layer occurs,
   wherein each of the word lines is connected to a gate electrode of the MOS transistor,
   wherein each of the first bit lines is connected to a second electrode connected to a second diffusion layer of the MOS transistor,
   wherein each of the second bit lines is connected to the second conductive layer, and wherein data is written by specifying one or more of the first bit lines connected to one or more of the selected memory cells to connect the one or more first bit lines to a ground, specifying one or more of the word lines connected to the one or more memory cells, and supplying a write voltage to the one or plurality of second bit lines, wherein data is read by specifying the one or more word lines connected to the one or more selected memory cells, and specifying the one or more first bit lines connected to the one or more memory cells to supply a read voltage which is lower than the write voltage to the one or more first bit lines, and wherein when the data is written or read, the one or more word lines are specified by allowing the voltage of the one or more word lines to be a gate threshold value voltage of the MOS transistor or more and to be a sum of a drive voltage of a circuit for specifying the one or more first bit lines and the gate threshold value voltage or less.

2. The memory cell array according to claim 1 further comprising:

a limiting member to limit the voltage of the first bit lines to the drive voltage or less.

3. The memory cell array according to claim 1, wherein at least two second bit lines among the second bit lines are connected to each other.

* * * * *